United States Patent
Beck et al.

(10) Patent No.: US 9,932,666 B2
(45) Date of Patent: Apr. 3, 2018

(54) FLUID-ASSISTED THERMAL MANAGEMENT OF EVAPORATION SOURCES

(71) Applicant: Siva Power, Inc., Santa Clara, CA (US)

(72) Inventors: Markus Eberhard Beck, Scotts Valley, CA (US); Ulrich Alexander Bonne, Sunnyvale, CA (US); Robert G. Wendt, Gilroy, CA (US)

(73) Assignee: SIVA POWER, INC., San Jose, CA (US)

( * ) Notice: Subject to any disclaimer, the term of this patent is extended or adjusted under 35 U.S.C. 154(b) by 0 days.

(21) Appl. No.: 15/082,290

(22) Filed: Mar. 28, 2016

(65) Prior Publication Data
US 2016/0289822 A1      Oct. 6, 2016

Related U.S. Application Data

(60) Provisional application No. 62/140,083, filed on Mar. 30, 2015.

(51) Int. Cl.
*H01L 21/00* (2006.01)
*C23C 14/26* (2006.01)
(Continued)

(52) U.S. Cl.
CPC .............. *C23C 14/26* (2013.01); *C23C 14/24* (2013.01); *C23C 14/243* (2013.01); *C23C 14/542* (2013.01); *C23C 16/0209* (2013.01); *C23C 16/28* (2013.01); *C23C 16/448* (2013.01); *C23C 16/4485* (2013.01); *C23C 16/52* (2013.01); *F25B 39/00* (2013.01); *F25D 17/02* (2013.01); *H01L 31/0322* (2013.01); *H01L 31/0326* (2013.01); *H01L 31/046* (2014.12); *H01L 31/18* (2013.01); *H01L 51/001* (2013.01); *H01L 51/56* (2013.01); *F25B 39/02* (2013.01); *H01L 21/02568* (2013.01); *H01L 21/02631* (2013.01)

(58) Field of Classification Search
CPC ... H01L 31/046; H01L 31/18; H01L 31/0326; H01L 31/0322; H01L 51/56; H01L 21/02568; H01L 21/0263; C23C 16/4485; C23C 14/26; F25B 39/02; F25B 39/00
See application file for complete search history.

(56) References Cited

U.S. PATENT DOCUMENTS

2008/0202426 A1*  8/2008  Suzuki ............... C23C 16/4481
                                                                118/726
2013/0025633 A1   1/2013  O'Donnell
(Continued)

FOREIGN PATENT DOCUMENTS

| CN | 202576560 U | 12/2012 |
| JP | 2003/273026 A | 9/2003 |
| KR | 10-2013-0091952 A | 8/2013 |

OTHER PUBLICATIONS

International Search Report and Written Opinion issued in a corresponding International Application No. PCT/US2016/024450 dated Jul. 29, 2016.

*Primary Examiner* — Caleb Henry
*Assistant Examiner* — Alexander Belousov
(74) *Attorney, Agent, or Firm* — Morgan, Lewis & Bockius LLP

(57) ABSTRACT

In various embodiments, evaporation sources for deposition systems are heated and/or cooled via a fluid-based thermal management system.

21 Claims, 5 Drawing Sheets

(51) Int. Cl.
  *H01L 31/046*    (2014.01)
  *C23C 16/448*    (2006.01)
  *F25B 39/00*     (2006.01)
  *H01L 31/032*    (2006.01)
  *H01L 31/18*     (2006.01)
  *H01L 51/00*     (2006.01)
  *H01L 51/56*     (2006.01)
  *C23C 16/02*     (2006.01)
  *C23C 16/28*     (2006.01)
  *C23C 16/52*     (2006.01)
  *C23C 14/24*     (2006.01)
  *C23C 14/54*     (2006.01)
  *F25D 17/02*     (2006.01)
  *F25B 39/02*     (2006.01)
  *H01L 21/02*     (2006.01)

(56) References Cited

U.S. PATENT DOCUMENTS

2013/0312855 A1* 11/2013 Birtcher .............. C23C 16/4481
                                                    137/544
2014/0370623 A1   12/2014 Wu et al.

* cited by examiner

FLUID-ASSISTED THERMAL MANAGEMENT OF EVAPORATION SOURCES

RELATED APPLICATION

This application claims the benefit of and priority to U.S. Provisional Patent Application No. 62/140,083, filed Mar. 30, 2015, the entire disclosure of which is hereby incorporated herein by reference.

TECHNICAL FIELD

In various embodiments, the present invention relates to thermal evaporation, in particular to thermal management of evaporation sources.

BACKGROUND

Thermal evaporation is a well-known approach to forming a number of materials such as III-V solid-state semiconductors via molecular beam epitaxial (MBE) growth. Another commercial application of this technique is the evaporation of aluminum (Al) onto polymer foils for the packaging industry or other metals onto polymer foils for capacitor manufacturing. In these applications, the sources are typically point sources either of the Knudsen cell design or the open boat design. Point sources are also used in manufacturing of thin-film photovoltaic (PV) devices, in particular copper indium gallium selenide (CuIn$_x$Ga$_{1-x}$Se$_2$ or CIGS) devices. In addition, large area organic light-emitting diode (OLED) devices are often fabricated using thermal evaporation sources. Due to their large-area substrates and required uniformity of the deposited layers, thermal evaporation sources utilized for OLEDs are typically of the linear type.

Some materials commonly deposited via thermal evaporation are difficult to heat up or cool down due to their poor heat capacity and poor thermal conductivity. Prime examples of such materials are phosphorous (P), sulfur (S), and selenium (Se). All of these elements have low heat capacities common for most solid elements coupled with rather poor thermal conductivities. Other group V elements, in particular arsenic (As) and antimony (Sb), also common in thermal evaporation, exhibit two orders of magnitude higher thermal conductivities. Tellurium (Te) is also of importance in various applications and has a moderate thermal conductivity one order of magnitude lower than As and P and one order of magnitude higher than P, S, and Se. Table 1 below provides exemplary values of heat capacities and thermal conductivities for these materials. In comparison, copper (Cu) has a molar heat capacity of 24.44 J mol$^{-1}$ K$^{-1}$ (0.385 J g$^{-1}$ K$^{-1}$) and a thermal conductivity of 401 W m$^{-1}$ K$^{-1}$ at room temperature.

TABLE 1

| Element | Molar Heat capacity [J · mol$^{-1}$ · K$^{-1}$] | Specific Heat Capacity [J · g$^{-1}$ · K$^{-1}$] | Thermal Conductivity [W · m$^{-1}$ · K$^{-1}$] |
|---|---|---|---|
| P | 23.82 | 0.769 | 0.236 |
| S | 22.75 | 0.705 | 0.205 |
| As | 24.57 | 0.328 | 50 |
| Se | 25.35 | 0.321 | 0.519 |
| Sb | 25.20 | 0.207 | 24 |
| Te | 25.65 | 0.201 | 3 |

Furthermore, the temperature/vapor pressure relationship for P, S, As, Se, and Te is significant when compared to metals such as Sb, Cu, or refractory metals such as molybdenum (Mo). As FIG. 1 shows, the vapor pressures of P, S, As, Se, and Te increase very rapidly with increasing temperature. In summary, thermal energy couples poorly into P, S, and Se (and Te), but when it does the vapor pressure of the material increases rapidly. These thermal properties for P, S, and Se complicate control of the evaporation rate in a thermal-evaporation process for these elements. In addition, the heat-up and cool-down times for large amounts of feedstock of these materials are long.

Given the cost sensitivity of commercial products—in particular for PV—manufacturing requires long system run times and short system turnaround ("green-to-green") times. Thus, evaporation sources typically hold significant volumes of feedstock to enable long-run campaigns. Coupled with the desire to increase throughput, high deposition rates and large-area substrates are essential to enabling lower manufacturing costs. Therefore, conventional high-throughput thermal evaporation sources have significant thermal mass and/or utilize continuous feed of the source material. For some materials continuous feed is a possibility (e.g., Al wire feed), while for many others it is not.

Conventional systems with high thermal mass have the added advantage that control of the thermal evaporation process is simplified as temperature fluctuations based on power fluctuations to the heaters are typically negligible. Highly effective thermal insulation further reduces sensitivity to incoming power fluctuations. Such thermal insulation also reduces heat losses to the surroundings, i.e., it increases thermal coupling efficiency of the electrical heater power to the material to be evaporated, leading to lower operating costs. In summary, high thermal mass and highly effective thermal insulation are important aspects of conventional industrial thermal evaporation processes.

In addition, turnaround times typically need to be short for industrial deposition processes. However, if the thermal evaporation source has a high thermal mass and highly effective insulation, the cool-down of the source between deposition runs will necessarily be slow. The impact is most severe if an unscheduled maintenance event necessitates shutdown of the equipment with the large-volume sources still holding significant amounts of feedstock. But even if the feedstock has been depleted, the bodies of the evaporation sources themselves still have significant thermal mass.

In view of the foregoing, there is a need for improved thermal-management systems and techniques for thermal evaporation that maintain high-quality insulation (and concomitant insensitivity to power fluctuations) during deposition cycles and that provide faster cooling and higher turnaround times between deposition cycles.

SUMMARY

Embodiments of the present invention utilize a heat-transfer fluid to supplement (or replace) other means of heating and/or cooling thermal evaporation sources, such as electric resistive heating and radiative cooling. In various embodiments, fluid-based thermal management is utilized only for heating (or additional heating), while in other embodiments, heat-transfer fluid is utilized only for cooling (or additional cooling). In various embodiments, the heat-transfer fluid is utilized as the primary or as a supplemental means of both heating and cooling of the thermal evaporation source.

In some embodiments, fluid-based heating and/or cooling is only utilized over a portion of the operating temperature range of the thermal evaporation source. The temperature range over which a heat-transfer fluid is utilized for thermal management of the evaporation source may be related to the temperature/vapor pressure relationship of the particular fluid. For example, if the fluid has a steep rise in vapor pressure at a temperature of 260° C., it may be utilized for heating only up to approximately that temperature or slightly below that temperature (e.g., approximately 250° C.). Beyond that temperature, pressurized gas (e.g., nitrogen gas) may be utilized to flush the fluid from the heating/cooling lines and/or the heated source so that the fluid is not subjected to higher temperatures. In various embodiments of the invention, regardless of the temperature-vapor pressure relationship of a heat-transfer fluid, the fluid may be utilized as the means for cooling (or a supplemental means for cooling) of the evaporation source. For example, the flow rate of the fluid may be sufficiently high to keep the heat-transfer fluid at a temperature below its critical temperature where decomposition occurs and/or below the temperature at which the vapor pressure increases dramatically.

In various embodiments of the present invention, heat-transfer fluid flows through the thermal evaporation source via two separate loops, one heated and one cooled. In other embodiments, a single fluid loop is utilized, and the fluid in the loop is heated (via, e.g., a heater) for heating of the source and cooled for cooling of the source. The heat-transfer fluid may be cooled utilizing, e.g., a heat exchanger. The heat exchanger may utilize any of several different techniques to cool the heat-transfer fluid, including thermal radiation from large-surface-area surfaces (e.g., fins or other projections) and/or air convection, or via heat exchange with a chilled water loop. Thermal management systems in accordance with embodiments of the invention also utilize control circuits to regulate the temperature and/or flow rate of the heat-transfer fluid based on the current and/or desired temperature of the thermal evaporation source.

Thermal evaporation processes typically are performed in vacuum ambients having very little background gas. This is necessary to reduce scattering of the material being evaporated so as to assure effective material transport from the evaporation source to the substrate upon which the evaporated material is to condense. As such, the primary loss of thermal energy in vacuum is via radiation, i.e., long-wavelength electromagnetic radiation. However, this process starts to lose effectiveness the lower the temperature of the body to be cooled and the smaller the temperature difference between the body cooling down and the system absorbing the thermal energy. Thus, in a vacuum environment, cooling via radiation is typically most effective above approximately 300° C. Similarly, coupling heat into evaporation sources operating at low temperatures (e.g., ≤400° C.) via radiation is also less effective, in particular if the material is one with poor thermal conductivity (e.g., P, S, or Se). The surface area of the reservoir wall to be exposed to radiation typically must be very large to efficiently couple radiative heat into these elements. Such concerns complicate both the reservoir and resistive heater design, as well as thermal evaporation rate control of these high-vapor-pressure elements.

Gas convection is another cooling technique. In gas convection processes, a gas passes over or through the body to be cooled and is able to transfer the thermal energy to a colder surface nearby. Given that thermal evaporation processes are typically performed under vacuum, hardly any heat is lost via conduction. However, at the end of the process it is possible to cool the deposition equipment with a gas—an operation which may be repeated in fill/purge sequences where small amounts of gas are introduced for short periods of times and then pumped out of the system again as they have heated up and become less effective in transferring heat away from the hot body. While this process has been utilized in existing systems, it has limitations based on the types of gases that are applicable. Air, the lowest cost gas mixture available, is not suitable as components in the vacuum system will oxidize. Nitrogen, another economical gas, has limited use as well; it may only be utilized below temperatures at which system component materials react with nitrogen. Moreover, both oxygen and nitrogen, like most gases, have relatively low heat capacities and are therefore less effective in convective cooling compared to, e.g., liquids. Noble or other inert gases may not react with any of the materials inside the deposition system, but are typically more expensive or have even lower heat capacities than nitrogen. For example, argon has a heat capacity only one-half that of nitrogen. On the other hand, at five times the heat capacity of nitrogen, helium (He) has the highest heat capacity of gases—apart from hydrogen (H)—and is extremely inert. But its cost is significantly higher than that of nitrogen.

In addition, since for low power consumption and stable processes the evaporation source relies on highly effective thermal insulation, it is often difficult to accomplish convection cooling with gases. The details largely depend on the type of insulation scheme. For example, if insulation is via shielding, a gas may penetrate the gap between the various layers of shielding, but if solid insulation is employed, the effect of convection cooling is limited by the rate of heat transfer (thermal conductivity) through the solid insulation.

However, liquid convection cooling as well as heating are especially well-matched to the thermal evaporation of many elements commonly utilized in thermal evaporation processes. Examples include P, S, and Se—elements with the above-described complexities of their thermal properties and temperature/vapor pressure dependence. Embodiments of the present invention utilize, in conjunction with the thermal evaporation source, a reservoir with high direct contact area of the evaporant (i.e., the feedstock or material to be evaporated) to the conduits (e.g., pipes) carrying the heat-transfer fluid. Such embodiments enable highly effective heat transfer from the heat-transfer fluid to the evaporant under heating and/or cooling conditions.

Various embodiments of the invention utilize a circulation system for heat-transfer fluid with two reservoirs (one heated, or "hot," and one cooled, or "cold") to enable rapid switching between heating and cooling of the thermal evaporation source. For example, a pipe system with heat exchanger internal to the reservoir of the thermal evaporation source may be connected to both the hot and cold reservoirs. Control mechanisms (e.g., solenoid valves) enable one to switch flow of heat-transfer fluid through either the heated or cooled reservoir.

Thus, embodiments of the present invention solve a manufacturing cost problem for processes employing thermal evaporation of materials with poor thermal conductivity and/or high vapor pressure/temperature dependence and/or operating temperatures at ≤400° C. Many heat-transfer fluids may be utilized at temperatures up to approximately 400° C., and thus, embodiments of the invention address heating and/or cooling (or supplemental heating and/or cooling) of a thermal evaporation source up to approximately that temperature. However, as mentioned above, heat-transfer fluid-assisted cooling may also be employed at temperatures significantly above 400° C. as long as the flow rates of the liquid coolant are sufficiently high to keep the fluid below its critical temperature. In addition, embodiments of the invention incorporating heat-transfer fluid-based heating and/or cooling beneficially reduce the response time of the source if perturbations of the source temperature are intentional and enable fast response to desired elevation or reduction of the source temperature. Such embodiments may be helpful during process development and optimization.

Thermal management for evaporation sources using heat-transfer fluids in accordance with embodiments of the invention may be utilized in various processes, such as MBE of III-V materials, deposition of OLED materials, and materials for thin-film photovoltaics such as CIGS or copper zinc tin sulfide (CZTS). As detailed herein, embodiments of the present invention reduce cost of ownership in manufacturing. As utilized herein, the term "fluid" may refer to a liquid and/or a gas unless otherwise specified. Embodiments of the invention may utilize heat-transfer fluids such as, e.g., water (e.g., deionized water), mixtures of water and glycol, silicones, dielectric fluids such as fluorocarbons or polyalphaolefin, and/or hydrocarbon oils.

In an aspect, embodiments of the invention feature a deposition system that includes or consists essentially of a deposition chamber, an evaporation source, and a thermal management system. The deposition chamber has an interior enclosed by one or more chamber walls. The evaporation source includes, consists essentially of, or consists of a hollow source body for containing a feedstock material for evaporation thereof and an evaporation port for fluidly coupling the source body with the interior of the deposition chamber. The thermal management system includes or consists essentially of a first reservoir, a first conduit, a heater, a second reservoir, a second conduit, a cooler, and a controller. The first reservoir contains heat-transfer fluid. The first conduit fluidly and/or thermally couples the first reservoir with the evaporation source. The heater heats heat-transfer fluid within the first reservoir. The second reservoir is different from the first reservoir and contains heat-transfer fluid. The second conduit fluidly and/or thermally couples the second reservoir with the evaporation source. At least a portion of the first conduit may be different from at least a portion of the second conduit. The cooler cools heat-transfer fluid within the second reservoir. The controller controls flow of heated and cooled heat-transfer fluid between the evaporation source and the first and second reservoirs to thereby control a temperature of the evaporation source.

Embodiments of the invention may include one or more of the following in any of a variety of combinations. The heater may include, consist essentially of, or consist of a heat exchanger, a laser source (and/or laser beam), an electron beam source (and/or electron beam), a thermoelectric heater, and/or a resistive heater. The cooler may include, consist essentially of, or consist of a heat exchanger, a thermoelectric cooler, and/or a source of chilled liquid (e.g., water). A feedstock material may be disposed within the source body. The feedstock material may include, consist essentially of, or consist of phosphorous, sulfur, arsenic, tellurium, and/or selenium.

In another aspect, embodiments of the invention feature a thermal evaporation source that includes, consists essentially of, or consists of a hollow source body for containing a feedstock material for evaporation thereof, an evaporation port for fluidly coupling the source body with an interior of a deposition chamber, a first conduit thermally coupled to an interior of the source body, a first reservoir for containing heat-transfer fluid, and a first mechanism for heating and/or cooling heat-transfer fluid within the first reservoir. The first reservoir is fluidly coupled to the first conduit.

Embodiments of the invention may include one or more of the following in any of a variety of combinations. The first mechanism for heating and/or cooling heat-transfer fluid may include, consist essentially of, or consist of a heater, a resistive heater, an electron beam (and/or a source thereof), a laser beam (and/or a source thereof), a thermoelectric heater, and/or a heat exchanger. A feedstock material may be disposed within the source body. The feedstock material may include, consist essentially of, or consist of phosphorous, sulfur, arsenic, tellurium, and/or selenium. The thermal evaporation source may include a second conduit thermally coupled to an interior of the source body, a second reservoir (for containing heat-transfer fluid) fluidly coupled to the second conduit, and a second mechanism for heating and/or cooling heat-transfer fluid within the second reservoir. The second mechanism for heating and/or cooling heat-transfer fluid may include, consist essentially of, or consist of a heater, a resistive heater, an electron beam (and/or a source thereof), a laser beam (and/or a source thereof), a thermoelectric heater, a thermoelectric cooler, and/or a heat exchanger. The thermal evaporation source may include a second reservoir (for containing heat-transfer fluid) fluidly coupled to the first conduit, as well as a second mechanism for heating and/or cooling heat-transfer fluid within the second reservoir. The second mechanism for heating and/or cooling heat-transfer fluid may include, consist essentially of, or consist of a heater, a resistive heater, an electron beam (and/or a source thereof), a laser beam (and/or a source thereof), a thermoelectric heater, a thermoelectric cooler, and/or a heat exchanger.

In yet another aspect, embodiments of the invention feature a method of thin-film deposition. An evaporation source is provided within a deposition system (e.g., an evaporation system). The evaporation source includes, consists essentially of, or consists of a source body containing a feedstock material and an evaporation port fluidly coupling the source body with an interior of the deposition chamber. A first reservoir of heat-transfer fluid is provided. The first reservoir is thermally coupled to the source body and/or the feedstock material. A processing ambient is established within the deposition chamber by (i) evacuating at least a portion of gas disposed within the deposition chamber, thereby establishing a vacuum ambient therein, and/or (ii) introducing a process gas within the deposition chamber. Heat-transfer fluid within the first reservoir is heated. The evaporation source is heated at least in part by flowing heated heat-transfer fluid (e.g., to and/or along and/or across the evaporation source and/or the source body), whereby at least a portion of the feedstock material vaporizes and exits the source body through the evaporation port.

Embodiments of the invention may include one or more of the following in any of a variety of combinations. The evaporation port may include, consist essentially of, or consist of one or more openings defined by the source body. The evaporation port may include an elongated portion extending away from the source body. An insulation material may be disposed around the evaporation source to reduce heat loss therefrom.

The process gas may be introduced within the deposition chamber. The process may react with the vaporized feedstock material. The insulation material may include, consist essentially of, or consist of carbon and/or a ceramic material. The insulation material may include, consist essentially of, or consist of graphite, carbon fiber, mullite, alumina, silica, and/or zirconia. The insulation material may include, consist essentially of, or consist of tantalum, niobium, and/or molybdenum. The insulation material may include, consist essentially of, or consist of a felt, a foam, a sol gel material, or a plurality of spaced-apart solid shields.

The first reservoir may be thermally coupled to the source body and/or the feedstock material via a first conduit extending from the first reservoir. Flowing heated heat-transfer fluid to heat the evaporation source may include, consist essentially of, or consist of flowing heated heat-transfer fluid through the first conduit. Heat-transfer fluid within the first reservoir may be cooled, and the evaporation source may be cooled at least in part by flowing cooled heat-transfer fluid through the first conduit. The evaporation source may be heated in part with a heat source other than heated heat-transfer fluid. The heat source may include, consist essentially of, or consist of a heater, a resistive heater, an electron beam (and/or a source thereof), a laser beam (and/or a source thereof), a thermoelectric heater, and/or a heat exchanger. Heat-transfer fluid within the first reservoir may be cooled, and the evaporation source may be cooled at least in part by flowing cooled heat-transfer fluid (e.g., to and/or along and/or across the evaporation source and/or the source body). The evaporation source may be cooled in part with a cooling source other than cooled heat-transfer fluid. The cooling source may include, consist essentially of, or consist of a gas flowed through and/or around at least a portion of the evaporation source, a heat exchanger, and/or a thermoelectric cooler.

A second reservoir of heat-transfer fluid may be provided. The second reservoir may be thermally coupled to the source body and/or the feedstock material. Heat-transfer fluid within the second reservoir may be cooled, and the evaporation source may be cooled at least in part by flowing cooled heat-transfer fluid (e.g., to and/or along and/or across the evaporation source and/or the source body). The second reservoir may be thermally coupled to the source body and/or the feedstock material via a second conduit extending from the second reservoir. Flowing cooled heat-transfer fluid to cool the evaporation source may include, consist essentially of, or consist of flowing cooled heat-transfer fluid through the second conduit. The evaporation source may be cooled in part with a cooling source other than cooled heat-transfer fluid. The cooling source may include, consist essentially of, or consist of a gas flowed through and/or around at least a portion of the evaporation source, a heat exchanger, and/or a thermoelectric cooler. The feedstock material may include, consist essentially of, or consist of phosphorous, sulfur, arsenic, tellurium, and/or selenium.

In another aspect, embodiments of the invention feature a method of thin-film deposition. An evaporation source is provided within a deposition system (e.g., an evaporation system). The evaporation source includes, consists essentially of, or consists of a source body containing a feedstock material and an evaporation port fluidly coupling the source body with an interior of the deposition chamber. A first reservoir of heat-transfer fluid is provided. The first reservoir is thermally coupled to the source body and/or the feedstock material. A processing ambient is established within the deposition chamber by (i) evacuating at least a portion of gas disposed within the deposition chamber, thereby establishing a vacuum ambient therein, and/or (ii) introducing a process gas within the deposition chamber. A heat-transfer fluid within the first reservoir is cooled. The evaporation source is heated, whereby at least a portion of the feedstock material vaporizes and exits the source body through the evaporation port. After the evaporation source is heated (e.g., after the at least a portion of the feedstock material vaporizes and exits the source body through the evaporation port), the evaporation source is cooled at least in part by flowing cooled heat-transfer fluid (e.g., to and/or along and/or across the evaporation source and/or the source body).

Embodiments of the invention may include one or more of the following in any of a variety of combinations. The evaporation port may include, consist essentially of, or consist of one or more openings defined by the source body. The evaporation port may include an elongated portion extending away from the source body. An insulation material may be disposed around the evaporation source to reduce heat loss therefrom. The process gas may be introduced within the deposition chamber. The process may react with the vaporized feedstock material. The insulation material may include, consist essentially of, or consist of carbon and/or a ceramic material. The insulation material may include, consist essentially of, or consist of graphite, carbon fiber, mullite, alumina, silica, and/or zirconia. The insulation material may include, consist essentially of, or consist of tantalum, niobium, and/or molybdenum. The insulation material may include, consist essentially of, or consist of a felt, a foam, a sol gel material, or a plurality of spaced-apart solid shields.

The first reservoir may be thermally coupled to the source body and/or the feedstock material via a first conduit extending from the first reservoir. Flowing cooled heat-transfer fluid to cool the evaporation source may include, consist essentially of, or consist of flowing cooled heat-transfer fluid through the first conduit. The evaporation source may be cooled in part with a cooling source other than cooled heat-transfer fluid. The cooling source may include, consist essentially of, or consist of a gas flowed through and/or around at least a portion of the evaporation source, a heat exchanger, and/or a thermoelectric cooler. The feedstock material may include, consist essentially of, or consist of phosphorous, sulfur, arsenic, tellurium, and/or selenium. The evaporation source may be heated, at least in part, with a heat source other than heated heat-transfer fluid. The heat source may include, consist essentially of, or consist of a heater, a resistive heater, an electron beam (and/or a source thereof), a laser beam (and/or a source thereof), a thermoelectric heater, and/or a heat exchanger.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the terms "approximately" and "substantially" mean±10%, and in some embodiments, ±5%. The term "consists essentially of" means excluding other materials that contribute to function, unless otherwise defined herein. Nonetheless, such other materials may be present, collectively or individually, in trace amounts. As used herein, the term "conduit" refers to one or more pipes, channels, ducts, tubes or other means for conveying a fluid (e.g., heat-transfer fluid).

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1:
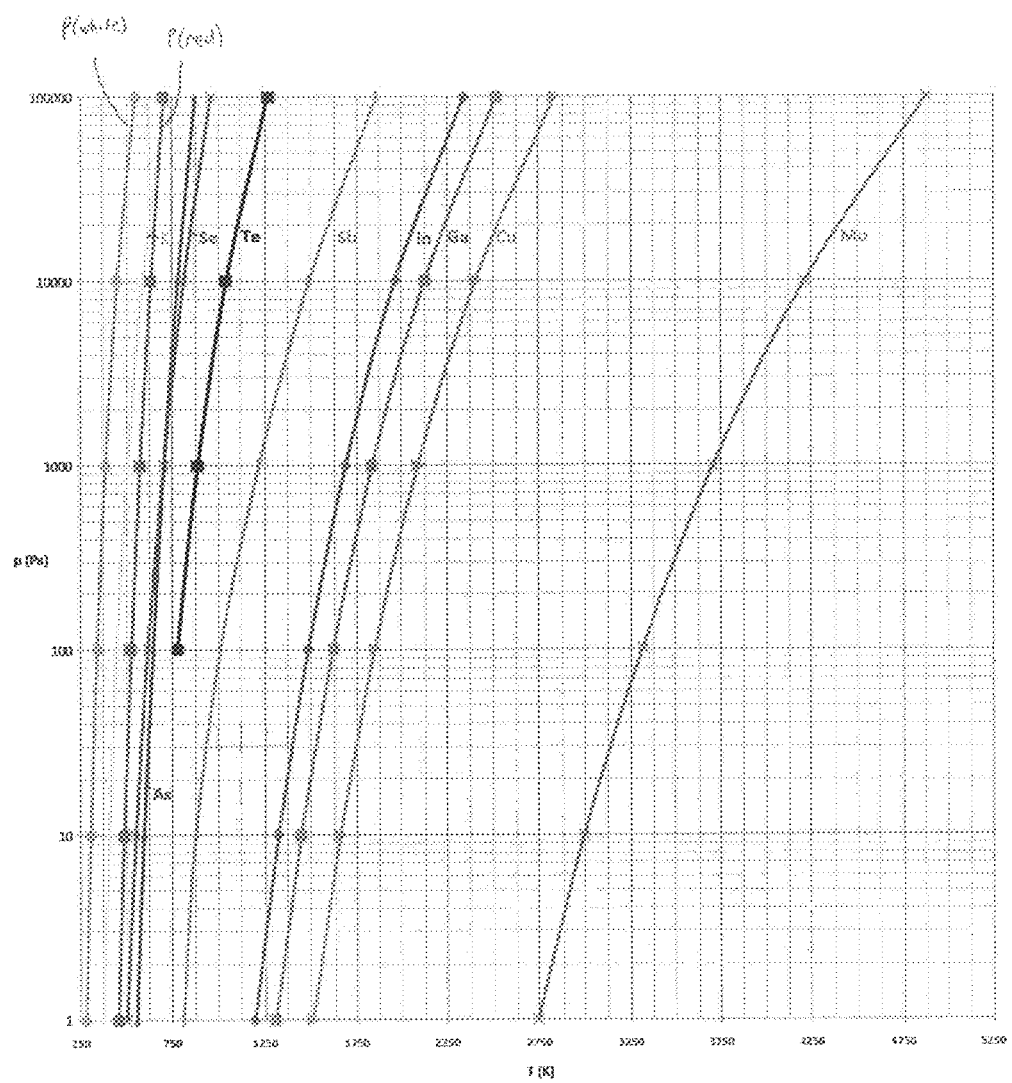
FIG. 1 is a graph of vapor pressure as a function of temperature for several different elements.
Figure 2:
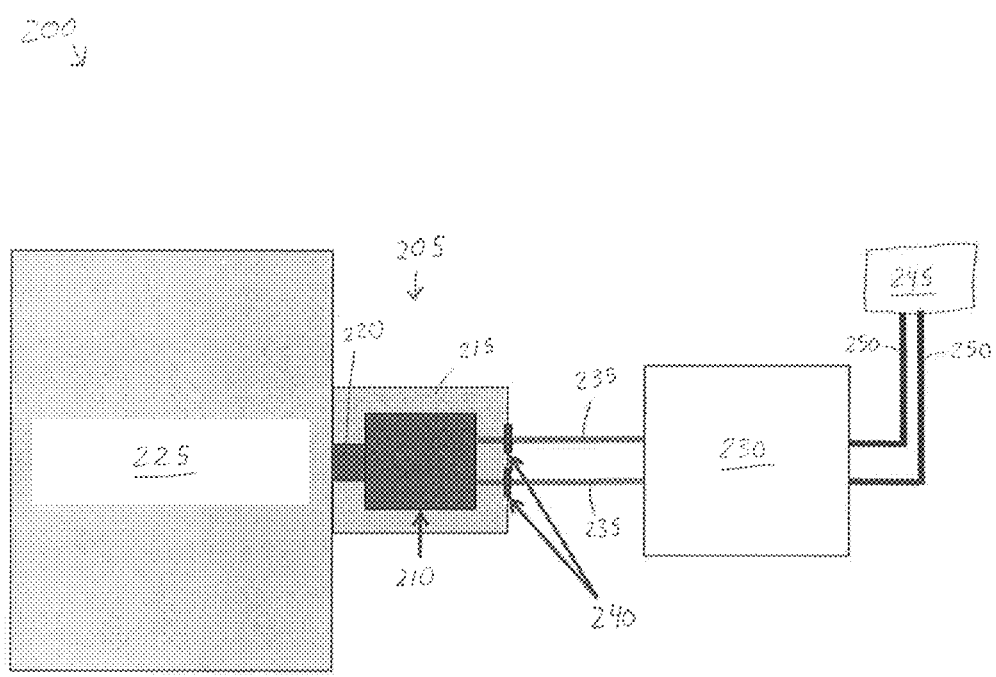
FIG. 2 is a schematic diagram of a deposition system in accordance with various embodiments of the invention.

FIG. 2 is a schematic diagram of an exemplary deposition system 200 in accordance with embodiments of the present invention. As shown, the system 200 features a thermal evaporation source 205 incorporating a reservoir 210 for feedstock material to be evaporated. The reservoir 210 is at least partially surrounded by a vacuum shell 215 that enables the establishment and maintenance of very low pressures (i.e., very high vacuums) in the deposition system 200. The source reservoir 210 has an evaporation port 220 through which the evaporant leaves the source 205 and enters a deposition chamber 225 for, e.g., deposition on one or more substrates. While only one evaporation source 205 is depicted in FIG. 2 for simplicity, embodiments of the present invention utilize two or more evaporation sources (e.g., for evaporation of different materials). Multiple evaporation sources may share a single fluid-based thermal management system, or each evaporation source may utilize its own dedicated fluid-based thermal management system. In various embodiments, the source 205 may be positioned partially or entirely inside the deposition chamber 225 rather than primarily outside of the deposition chamber as depicted in FIG. 2.

The source reservoir 210 is typically a hollow container for containing the feedstock material during evaporation thereof. The source reservoir 210 may include, consist essentially of, or consist of, for example, one or more refractory metals (e.g., tantalum, tungsten, and/or molybdenum) and/or one or more ceramic materials such as alumina and/or boron nitride and/or one or more corrosion-resistant metal alloys such as nickel-based alloys containing one or more alloying elements (e.g., molybdenum, chromium, cobalt, iron, copper, manganese, titanium, zirconium, aluminum, carbon, and/or tungsten), for example, one or more Hastelloy alloys available from Haynes International Inc. of Kokomo, Ind. In various embodiments, one or more surfaces of the source body (e.g., the surfaces facing and/or in contact with the feedstock material) may be coated or lined with a lining material, e.g., a ceramic material such as alumina and/or boron nitride. The source reservoir 210 and any insulation material therearound may be heated by one or more heaters disposed proximate or around the evaporation source. The one or more heaters may include or consist essentially of, for example, a furnace in which the source is disposed or one or more resistive heaters disposed around the source. Exemplary feedstock materials used in various embodiments of the present invention include P, S, As, Se, and/or Te.

FIG. 2 depicts the evaporation source 205 having its evaporation port 220 facing sideways toward deposition chamber 225, but other orientations of the port 220 are possible. For example, the port 220 may be oriented to allow evaporant release upward or even downward. Moreover, insulation may be disposed around one or more sides of the source reservoir 210. In addition, while the evaporation port 220 is depicted in FIG. 2 as being a substantially straight regular cylinder, in various embodiments the evaporation port 220 has a width or diameter that tapers (wider or narrower) as a function of distance from the source reservoir 210. In various embodiments, the evaporation port 220 may include or consist essentially of a manifold port or a showerhead port, variants known to those of skill in the art.

As shown in FIG. 2, a fluid-based thermal management system 230 is connected by one or more conduits 235 (e.g., pipes) to the source 205 via, for example, one or more vacuum feedthroughs 240 that seal around the conduit(s) 235 to maintain vacuum within the deposition system 200. The fluid-based thermal management system 230 may be fluidly connected to a source 245 of process chilled water (PCW) for, e.g., cooling of the heat-transfer fluid heated by exposure to the evaporation source. The fluid-based thermal management system 230 may be fluidly connected to the source 245 via one or more conduits 250 (e.g., pipes). The source 245 may include or consist essentially of, e.g., a reservoir of water or other fluid. Electric or combustion fuel or heat exchange heating of the heat-transfer fluid may also be present as part of the fluid-based thermal management system. Additional means of heating the evaporant—e.g., resistive electrical heating elements coupled to and/or disposed around and/or in the source reservoir 210—may be present simultaneously to the heat-transfer fluid-based loop.

Figure 3:
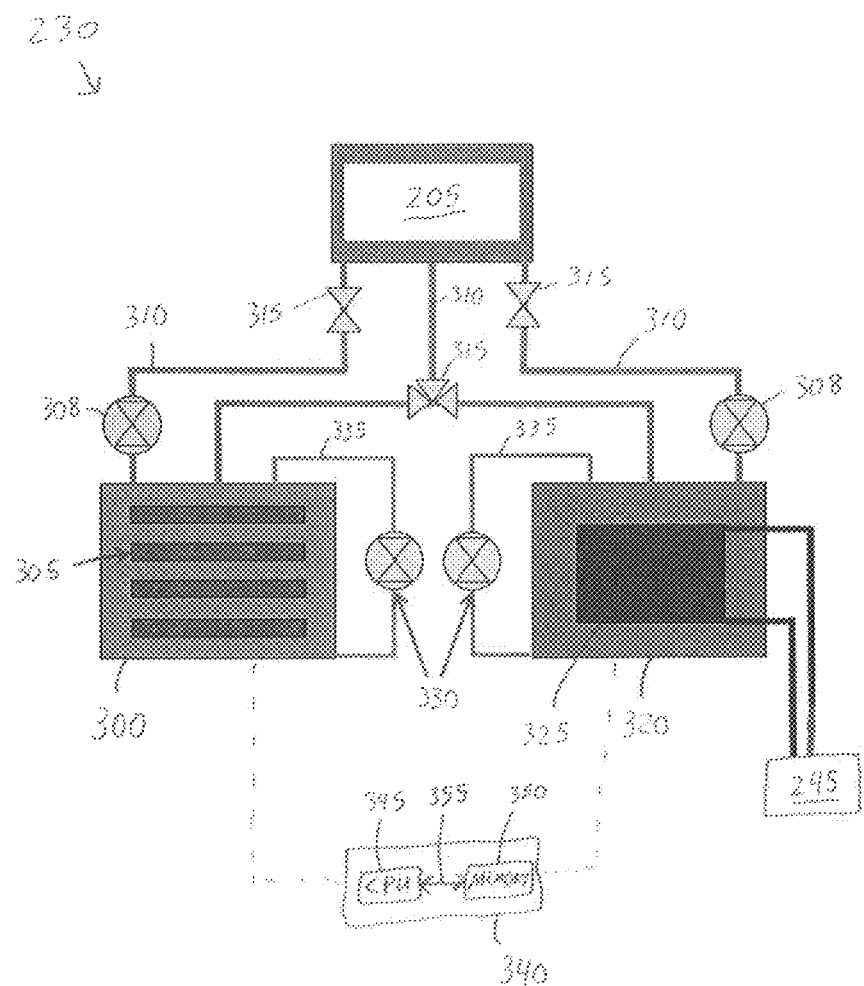
FIG. 3 is a schematic diagram of an evaporation source utilizing a fluid-based thermal management system in accordance with various embodiments of the invention.

FIG. 3 is a schematic diagram of an exemplary fluid-based thermal management system 230 in accordance with embodiments of the present invention. As shown, the thermal management system 230 features two different reservoirs for heat-transfer fluid. A reservoir 300 contains heat-transfer fluid and heats the fluid by, e.g., resistive heaters 305 thermally coupled to the reservoir 300. The heated heat-transfer fluid is channeled to the evaporation source 205 by one or more pumps 308 via a series of conduits 310 (e.g., pipes) and valves 315, as shown. A reservoir 320 also contains heat-transfer fluid (which may be the same or different from the fluid within the heated reservoir 300 ) and cools the fluid by, e.g., a heat exchanger 325 and recirculation of chilled water from PCW source 245 for thermal exchange. The cooled heat-transfer fluid is also channeled to and from the evaporation source 205 by one or more pumps 308 via a series of conduits 310 and valves 315, as shown. While two different reservoirs 300, 320 are depicted in FIG. 3, embodiments of the invention utilize a single reservoir of heat-transfer fluid that is heated or cooled on demand, depending on the desired temperature regulation of the evaporation source 205. The conduits 310 connecting the reservoirs 300, 320 to the evaporation source 205 typically form a closed loop, and extend within the source 205 (e.g., on a sinuous path) to maximize thermal contact between the heat-transfer fluid and the feedstock in the evaporation source 205. As shown in FIG. 3, recirculation pumps 330 may be utilized to recirculate the heat-transfer fluid within the reservoirs, via conduits 335, to thereby maintain the heat-transfer fluid within each reservoir 300, 320 at a substantially constant temperature.

The operation of reservoirs 300, 320 and the resulting flow of heat-transfer fluid to and from the evaporation source 205 may be responsive to a computer-based control system so that the temperature of the source 205 may be controlled before, during, and/or after deposition processes that take place at elevated temperatures. For example, as shown in FIG. 3, in various embodiments of the present invention, a control system 340 may be electrically connected and/or mechanically connected to the reservoirs 300, 320, valves 315, 330, and/or pumps 308 and thus control various operations of the fluid-based thermal management system 230.

The computer-based control system (or "controller") 340 in accordance with embodiments of the present invention may include or consist essentially of a general-purpose computing device in the form of a computer including a processing unit (or "computer processor") 345, a system memory 350, and a system bus 355 that couples various system components including the system memory 350 to the processing unit 345. Computers typically include a variety of computer-readable media that can form part of the system memory 350 and be read by the processing unit 345. By way of example, and not limitation, computer readable media may include computer storage media and/or communication media. The system memory 350 may include computer storage media in the form of volatile and/or nonvolatile memory such as read only memory (ROM) and random access memory (RAM). A basic input/output system (BIOS), containing the basic routines that help to transfer information between elements, such as during start-up, is typically stored in ROM. RAM typically contains data and/or program modules that are immediately accessible to and/or presently being operated on by processing unit 345. The data or program modules may include an operating system, application programs, other program modules, and program data. The operating system may be or include a variety of operating systems such as Microsoft WINDOWS operating system, the Unix operating system, the Linux operating system, the Xenix operating system, the IBM AIX operating system, the Hewlett Packard UX operating system, the Novell NETWARE operating system, the Sun Microsystems SOLARIS operating system, the OS/2 operating system, the BeOS operating system, the MACINTOSH operating system, the APACHE operating system, an OPENSTEP operating system or another operating system of platform. In various embodiments, the controller 340 and/or one or more components thereof may include or consist essentially of a programmable logic controller operating in accordance with, e.g., a set of pre-compiled instructions and/or programs.

Any suitable programming language may be used to implement without undue experimentation the functions described herein. Illustratively, the programming language used may include assembly language, Ada, APL, Basic, C, C++, C*, COBOL, dBase, Forth, FORTRAN, Java, Modula-2, Pascal, Prolog, Python, REXX, and/or JavaScript for example. Further, it is not necessary that a single type of instruction or programming language be utilized in conjunction with the operation of systems and techniques of the invention. Rather, any number of different programming languages may be utilized as is necessary or desirable.

The computing environment may also include other removable/nonremovable, volatile/nonvolatile computer storage media. For example, a hard disk drive may read or write to nonremovable, nonvolatile magnetic media. A magnetic disk drive may read from or writes to a removable, nonvolatile magnetic disk, and an optical disk drive may read from or write to a removable, nonvolatile optical disk such as a CD-ROM or other optical media. Other removable/nonremovable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The storage media are typically connected to the system bus through a removable or non-removable memory interface.

The processing unit 345 that executes commands and instructions may be a general-purpose computer processor, but may utilize any of a wide variety of other technologies including special-purpose hardware, a microcomputer, mini-computer, mainframe computer, programmed micro-processor, micro-controller, peripheral integrated circuit element, a CSIC (Customer Specific Integrated Circuit), ASIC (Application Specific Integrated Circuit), a logic circuit, a digital signal processor, a programmable logic device such as an FPGA (Field Programmable Gate Array), PLD (Programmable Logic Device), PLA (Programmable Logic Array), RFID processor, smart chip, or any other device or arrangement of devices that is capable of implementing the steps of the processes of embodiments of the invention. For example, the memory 350 may store therewithin one or deposition (e.g., thermal-evaporation) recipes including instructions (e.g., desired thermal profiles, heating times, etc.) utilized by the controller 340 to control the various components and systems of the deposition system, e.g., valves, interlocks, pumps, heating systems, reservoirs 300, 320, etc. The recipes may include indications before, during, and/or after evaporation processes for the controller 340 to cool and/or heat evaporation source 205 and the feedstock therewithin in order to, e.g., improve throughput. The controller 340 may include one or more user interfaces and/or input/output devices (e.g., keyboard, display, mouse or other pointing device, etc.) for accepting user commands and/or for the inputting of recipe information.

Figure 4A:
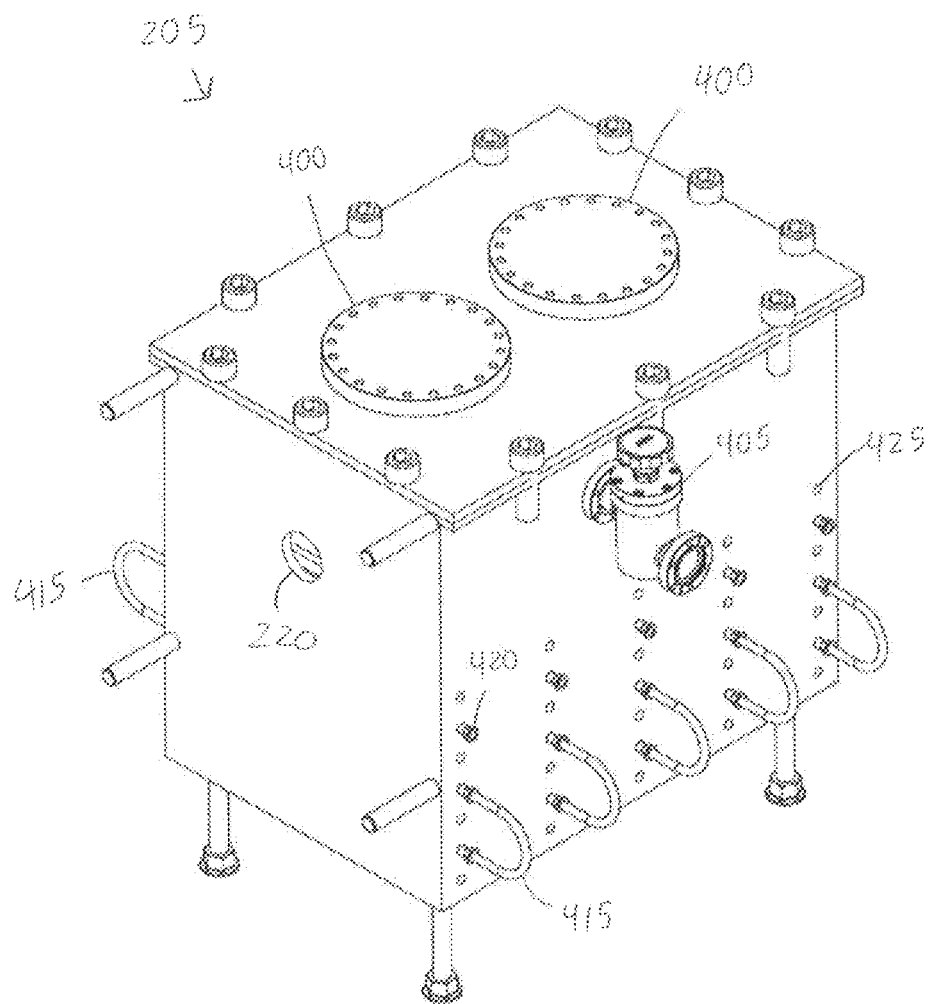
FIG. 4A is a perspective view of an evaporation source in accordance with various embodiments of the invention.
Figure 4B:
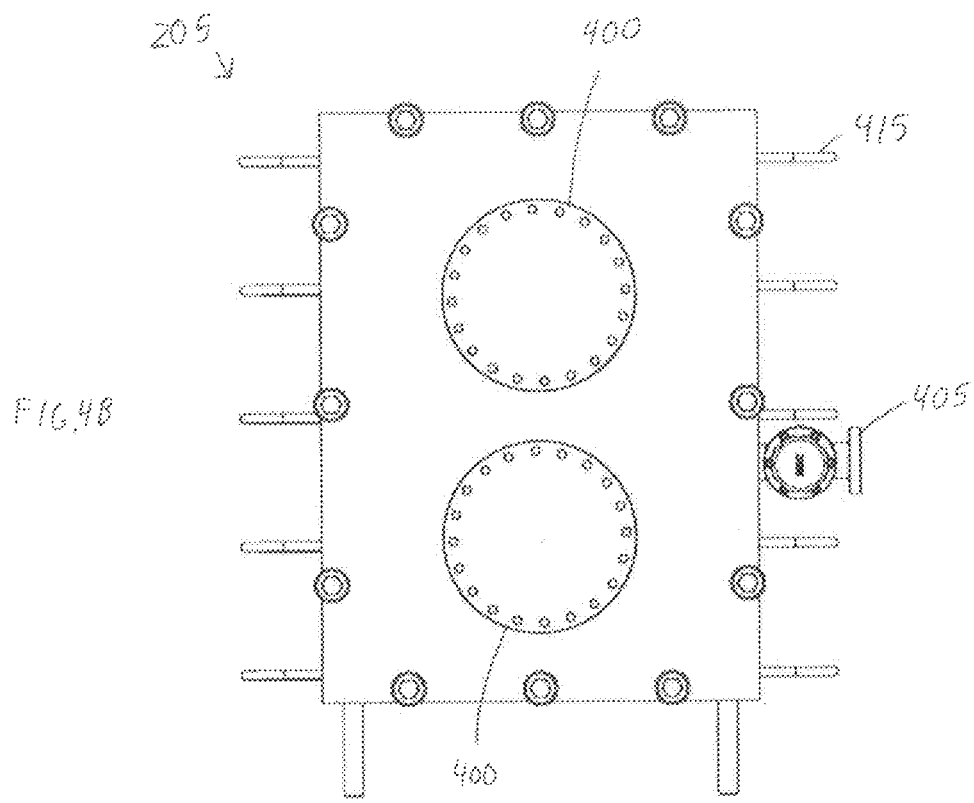
FIG. 4B is a top view of the evaporation source of FIG. 4A.
Figure 4C:
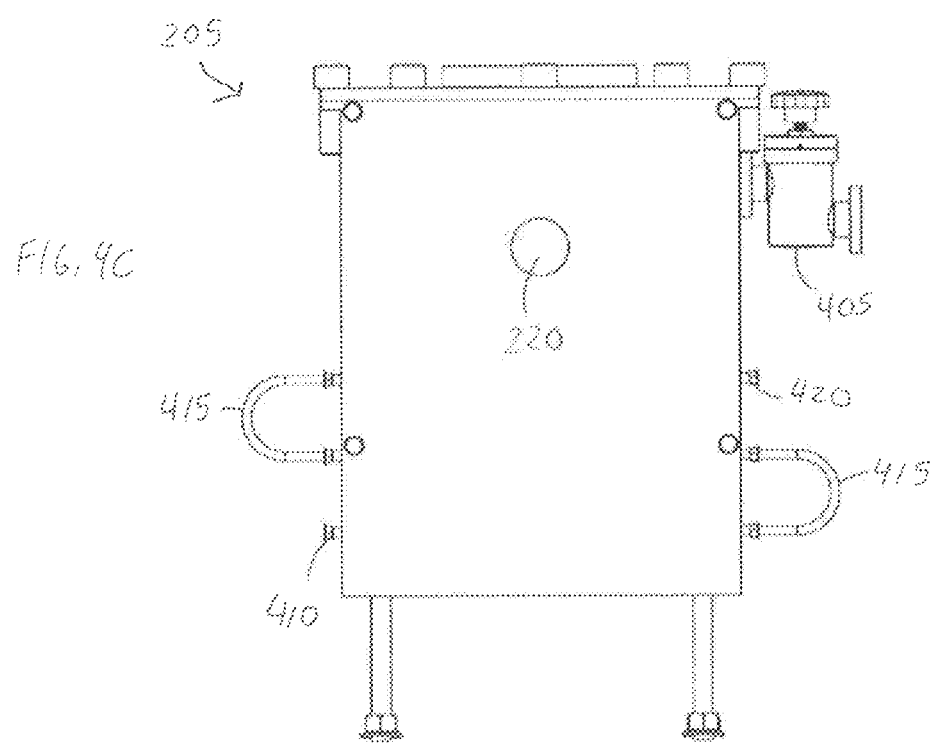
FIG. 4C is a side view of the evaporation source of FIG. 4A.

FIGS. 4A-4C depict an exemplary thermal evaporation source 205 usable in accordance with embodiments of the present invention. The exemplary source 205 may have one or more fill ports 400 through which the feedstock material to be evaporated may be introduced into the source 205. As shown, the fill ports 400 may each be occluded by a cover after filling and during evaporation. The source 205 may be evacuated and/or vented before and/or after operation via a valve 405. The heated feedstock exits the source 205 via the evaporation port 220, as detailed herein. Heat-transfer fluid for heating and/or cooling the feedstock material within the source 205 is introduced via one or more fluid inlets 410, flows through one or more conduits 415 fluidically coupled to the inlets 410 (and fluidically isolated from but thermally coupled to the feedstock material itself), and exits the source via one or more fluid outlets 420. Additional means of heating the feedstock material—e.g., resistive electrical heating elements thermally coupled to the reservoir 210 of the source 205—may be present simultaneously to this heat-transfer fluid-based loop. For example, resistive heaters and/or other auxiliary heaters or coolers may be inserted into source 205 via one or more channels 425 for thermal coupling to the feedstock material within source 205.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A deposition system comprising:
a deposition chamber having an interior enclosed by one or more chamber walls;
an evaporation source comprising (i) a hollow source body for containing a feedstock material for evaporation thereof, and (ii) an evaporation port for fluidly coupling the source body with the interior of the deposition chamber; and
a thermal management system comprising:
a first reservoir for containing heat-transfer fluid,
a first conduit for thermally coupling the first reservoir with the evaporation source, a portion of the first conduit being disposed within the source body so as to directly contact feedstock material disposed within the source body,
a heater for heating heat-transfer fluid within the first reservoir,
a second reservoir, different from the first reservoir, for containing heat-transfer fluid,
a second conduit for thermally coupling the second reservoir with the evaporation source, a portion of the second conduit being disposed within the source body so as to directly contact feedstock material disposed within the source body,
a cooler for cooling heat-transfer fluid within the second reservoir, and
a controller for controlling flow of heated and cooled heat-transfer fluid through the first and second conduits between the evaporation source and the first and second reservoirs to thereby control a temperature of the evaporation source, whereby heating of the evaporation source at least in part via flow of heated heat-transfer fluid through the first conduit results in vaporization of feedstock material in the source body and flow of vaporized feedstock material into the deposition chamber via the evaporation port.

2. The deposition system of claim 1, wherein the heater comprises at least one of a heat exchanger or a resistive heater.

3. The deposition system of claim 1, wherein the cooler comprises a heat exchanger.

4. The deposition system of claim 1, further comprising a feedstock material disposed within the source body.

5. The deposition system of claim 4, wherein the feedstock material comprises at least one of phosphorous, sulfur, arsenic, tellurium, or selenium.

6. The deposition system of claim 1, wherein the thermal management system comprises a second heater for heating the evaporation source in tandem with flow of heated heat-transfer fluid through the first conduit.

7. The deposition system of claim 6, wherein the second heater comprises at least one of a resistive heater, an electron beam source, a laser source, a thermoelectric heater, or a heat exchanger.

8. The deposition system of claim 1, wherein the thermal management system comprises a second cooler for cooling the evaporation source in tandem with flow of cooled heat-transfer fluid through the second conduit.

9. The deposition system of claim 8, wherein the second cooler comprises a source of gas, a heat exchanger, or a thermoelectric cooler.

10. A thermal evaporation source comprising:
a hollow source body for containing a feedstock material for evaporation thereof;
an evaporation port for fluidly coupling the source body with an interior of a deposition chamber;
a first conduit thermally coupled to an interior of the source body, a portion of the first conduit being disposed within the source body so as to directly contact feedstock material disposed within the source body;
fluidly coupled to the first conduit, a first reservoir for containing heat-transfer fluid; and
a first mechanism for heating and/or cooling heat-transfer fluid within the first reservoir, whereby heating of the evaporation source at least in part via flow of heated heat-transfer fluid through the first conduit results in vaporization of feedstock material in the source body and flow of vaporized feedstock material into the deposition chamber via the evaporation port.

11. The thermal evaporation source of claim 10, wherein the first mechanism for heating and/or cooling heat-transfer fluid comprises at least one of a heater, a resistive heater, or a heat exchanger.

12. The thermal evaporation source of claim 10, further comprising a feedstock material disposed within the source body.

13. The thermal evaporation source of claim 12, wherein the feedstock material comprises at least one of phosphorous, sulfur, arsenic, tellurium, or selenium.

14. The thermal evaporation source of claim 10, further comprising:
a second conduit thermally coupled to an interior of the source body;
fluidly coupled to the second conduit, a second reservoir for containing heat-transfer fluid; and
a second mechanism for heating and/or cooling heat-transfer fluid within the second reservoir.

15. The thermal evaporation source of claim 14, wherein the second mechanism for heating and/or cooling heat-transfer fluid comprises at least one of a heater, a resistive heater, or a heat exchanger.

16. The thermal evaporation source of claim 10, further comprising:
fluidly coupled to the first conduit, a second reservoir for containing heat-transfer fluid; and
a second mechanism for heating and/or cooling heat-transfer fluid within the second reservoir.

17. The thermal evaporation source of claim 16, wherein the second mechanism for heating and/or cooling heat-transfer fluid comprises at least one of a heater, a resistive heater, or a heat exchanger.

18. The thermal evaporation source of claim 10, further comprising a heater for heating the evaporation source in tandem with flow of heated heat-transfer fluid through the first conduit.

19. The thermal evaporation source of claim 18, wherein the heater comprises at least one of a resistive heater, an electron beam source, a laser source, a thermoelectric heater, or a heat exchanger.

20. The thermal evaporation source of claim 10, further comprising a cooler for cooling the evaporation source in tandem with flow of cooled heat-transfer fluid through the first conduit.

21. The thermal evaporation source of claim 20, wherein the cooler comprises a source of gas, a heat exchanger, or a thermoelectric cooler.

* * * * *